(12) United States Patent
Lee et al.

(10) Patent No.: US 7,205,194 B2
(45) Date of Patent: Apr. 17, 2007

(54) METHOD OF FABRICATING A FLASH MEMORY CELL

(75) Inventors: Yong-Sun Lee, Seoul (KR); Jae-Min Yu, Seoul (KR); Don-Woo Lee, Hwaseong-si (KR); Jung-Hun Cho, Gunpo-si (KR); Chul-Soon Kwon, Seoul (KR); Jung-Ho Moon, Yongin-si (KR); In-Gu Yoon, Suwon-si (KR); Jae-Hyun Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 119 days.

(21) Appl. No.: 10/874,579

(22) Filed: Jun. 24, 2004

(65) Prior Publication Data

US 2005/0064661 A1    Mar. 24, 2005

(30) Foreign Application Priority Data

Sep. 22, 2003    (KR) ...................... 10-2003-0065679

(51) Int. Cl.
*H01L 21/336* (2006.01)

(52) U.S. Cl. ...................... 438/257; 438/734; 438/738; 438/692; 257/E21; 257/68; 257/209; 257/422; 257/E29; 257/129

(58) Field of Classification Search ................ 438/257, 438/267, 680, 692, 676, 679, 706, 745, 733, 438/734, 738, 756, 757
See application file for complete search history.

(56) References Cited

U.S. PATENT DOCUMENTS

| 5,029,130 | A | * | 7/1991 | Yeh | ........................ | 365/185.31 |
| 5,242,848 | A | * | 9/1993 | Yeh | ............................. | 438/266 |
| 6,071,777 | A | * | 6/2000 | Chen | .......................... | 438/257 |
| 6,284,596 | B1 | * | 9/2001 | Sung et al. | .................. | 438/257 |
| 6,469,341 | B1 | * | 10/2002 | Sung et al. | .................. | 257/316 |
| 6,476,440 | B1 | * | 11/2002 | Shin | ........................... | 257/320 |
| 6,551,867 | B1 | * | 4/2003 | Ozeki et al. | ................ | 438/159 |
| 6,753,569 | B2 | * | 6/2004 | Lin et al. | .................... | 257/314 |

FOREIGN PATENT DOCUMENTS

JP    11-284084    10/1999

* cited by examiner

*Primary Examiner*—David Nhu
(74) *Attorney, Agent, or Firm*—Volentine & Whitt, PLLC

(57) ABSTRACT

A method of fabricating a flash memory cell having a split gate structure. A sacrificial layer is formed on a floating gate layer formed on a semiconductor substrate. The sacrificial layer is etched to form an opening exposing a portion of the floating gate layer. A gate interlayer insulating layer pattern is formed inside the opening. After removing the sacrificial layer pattern and etching the floating gate layer (using the gate interlayer insulating layer pattern as an etch mask), a floating gate is formed under the gate interlayer insulating layer pattern. A control gate is formed overlapping a portion of the floating gate.

20 Claims, 12 Drawing Sheets

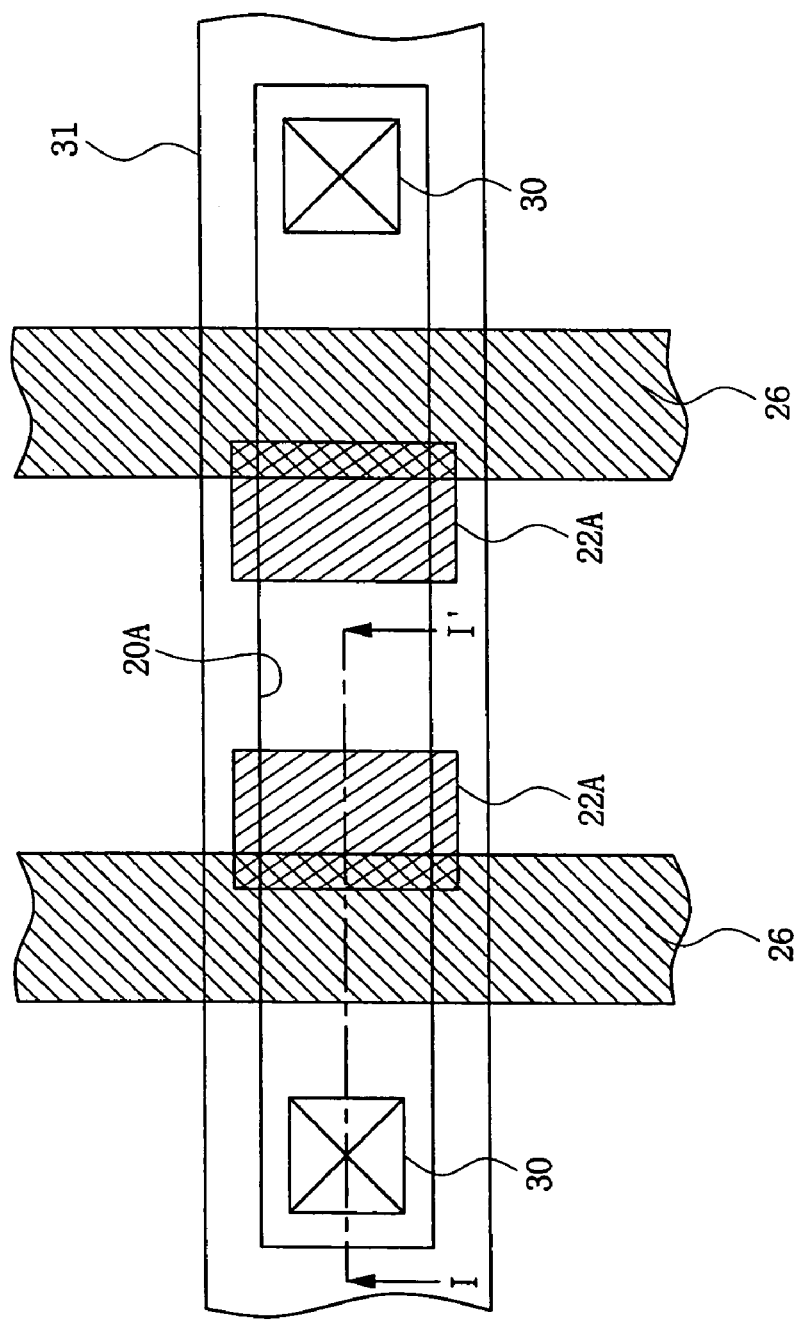

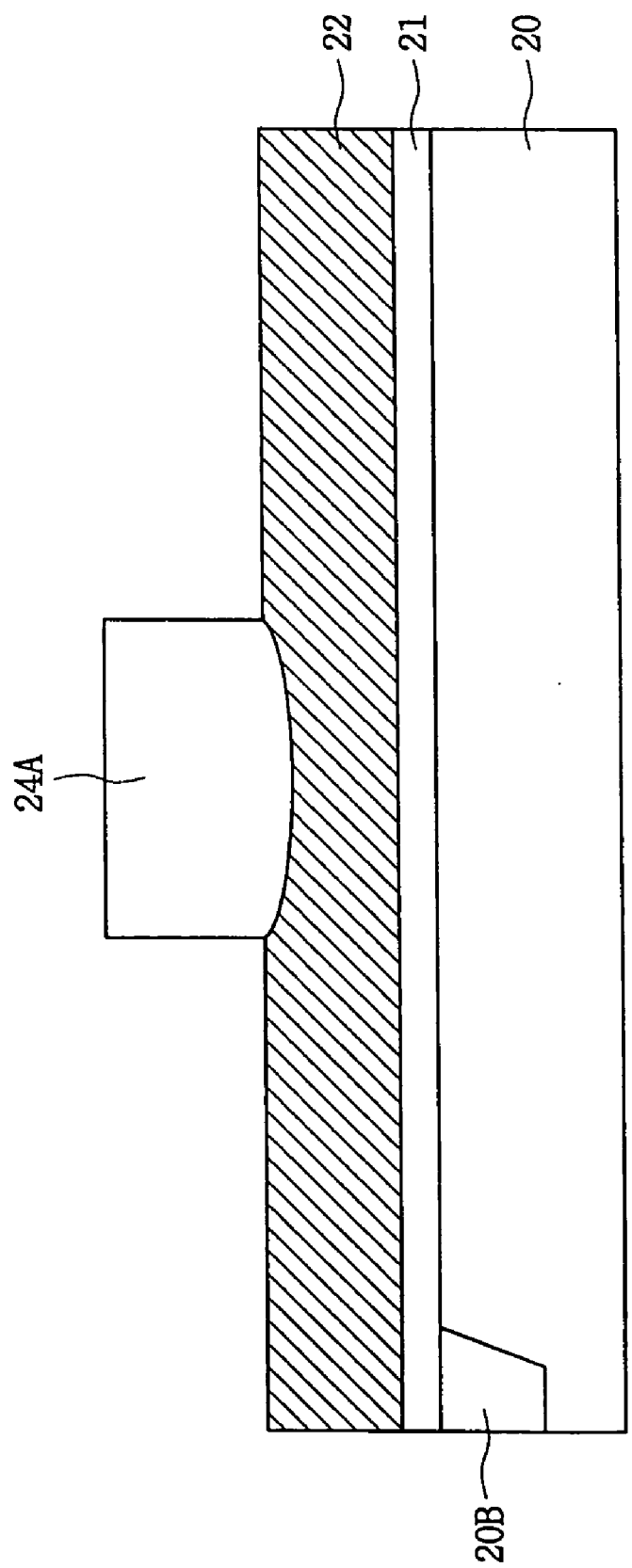

METHOD OF FABRICATING A FLASH MEMORY CELL

BACKGROUND OF THE INVENTION

1. Field of the Invention

Embodiments of the present invention generally relate to a method of fabricating a flash memory cell having a split gate structure.

This application claims the benefit of Korean Patent Application No. 2003-65679, filed Sep. 22, 2003, the disclosure of which is hereby incorporated herein by reference in its entirety.

2. Description of the Related Art

A flash memory device is a nonvolatile memory device capable of retaining data after a power supply is cut off. A nonvolatile memory device can be highly-integrated by taking advantage of EPROM (erasable programmable read only memory) and/or EEPROM (electrically erasable programmable read only memory) technologies. A related art flash memory cell has a stack-gate structure including a tunnel oxide layer, a floating gate, an insulating layer, and a control gate, which are stacked on a semiconductor substrate between a source and a drain.

The stack-gate structure may be problematic, due to an over-erase phenomenon. In efforts to solve this over-erase problem, flash memory cells having a split gate structure have been suggested. Japanese Laid Open Disclosure No. 1999-284084 describes a method of fabricating a split gate structure using a LOCOS process. Japanese Laid Open Disclosure No. 1999-284084 by Otani Toshiharu has the title 'NONVOLATILE SEMICONDUCTOR STORAGE DEVICE AND ITS MANUFACTURE'.

FIGS. 1A to 1E illustrate a method of fabricating a flash memory cell having a split gate structure. In FIG. 1A, a gate oxide layer 11, a first polysilicon layer 12, and a silicon nitride layer 13 are stacked on a semiconductor substrate 10. In FIG. 1B, by patterning the silicon nitride layer 13, a silicon nitride layer pattern 13A is formed having an opening 13B, exposing a portion of the first polysilicon layer 12. In FIG. 1C, a poly oxide layer 14 is formed by performing a LOCOS (local oxidation of silicon) process using the silicon nitride layer pattern 13A as an oxidation stop layer. A portion of the exposed first polysilicon layer 12 is consequently oxidized.

In FIG. 1D, a floating gate 12A is formed under the poly oxide layer 14 by removing the silicon nitride layer pattern 13A and etching the first polysilicon layer 12. The etching of the first polysilicon layer 12 uses the poly oxide layer 14 as an etch mask. In FIG. 1E, an oxide layer 15 is formed on the semiconductor substrate 10 and the poly oxide layer 14. A control gate 16, overlapping a portion of the floating gate 12A, is formed of a second polysilicon layer. Spacers 17 are formed on the sidewalls of the floating gate 12A and the control gate 16. Source/drain 18A, 18B are formed inside the semiconductor substrate 10. The oxide layer 15 functions as a tunnel oxide layer 15A in the region between the floating gate 12A and the control gate 16. The oxide layer 15 functions as a gate oxide layer 15B in the region between the semiconductor substrate 10 and the control gate 16.

There may be complications in the above described related art LOCOS process of fabricating a split gate structure. Specifically, there may be complications in forming the poly oxide layer 14 having a uniform thickness, as insulation between the floating gate 12A and the control gate 16. Further, there may be complications in the LOCOS process due to a heat budget. The thermal oxidation is performed at a temperature of about 800° C., which may cause a smiling effect to thicken the boundary of the gate oxide layer. This may result in degradation of cell characteristics, and consequential malfunctioning may occur during programming and erasing operations.

Many parasitic capacitors intrinsically exist in the flash memory cell having the split gate structure, fabricated in accordance with the related art. In FIG. 1E, a tunnel capacitor ($C_t$) is illustrated between the sidewalls of the control gate 16 and the floating gate 12A. A gate interlayer capacitor ($C_{ip}$) is illustrated between the control gate 16 and the upper surface of the floating gate 12A. Further, a channel capacitor ($C_c$) is illustrated between the floating gate 12A and the semiconductor substrate 10. A source capacitor ($C_s$) is illustrated between the floating gate 12A and the source 18A.

The program operation of the flash memory cell having a split gate structure, as shown in FIG. 1E, is explained below. A high voltage is applied on the source 18A and a ground voltage is applied on the drain 18B. The electrons generated in the drain 18B, move to the source 18A through the channel region formed in the semiconductor substrate 10 when a program voltage is applied to the control gate 16. The program voltage is lower than the voltage applied on the source 18A and higher than the threshold voltage for the formation of the channel region. Some of the electrons moving to the source 18A are excited by the potential difference between the drain 18B and the floating gate 12A, coupled by the high voltage applied on the source 18A. These excited electrons are injected into the floating gate 12A. In other words, the program operation is performed by hot carrier injection into the floating gate 12A. Using FIG. 1E as an illustration a program coupling ratio ($r_p$) can be represented by Equation 1.

$$r_p = \frac{C1 + C2}{C1 + C2 + C3 + C4} \quad \text{[Equation 1]}$$

In Equation 1, 'C1', 'C2', 'C3', and 'C4' are the capacitance of the source capacitor ($C_s$), the capacitance of the channel capacitor ($C_c$), the capacitance of the tunnel capacitor ($C_t$), and the capacitance of the gate interlayer capacitor ($C_{ip}$), respectively.

The erase operation of the flash memory cell, having a split gate structure, is explained below. If a high voltage is applied on the control gate 16, a ground voltage is applied on the source 18A, and a ground voltage is applied to the drain 18B. The electrons charged in the floating gate 12A are removed to the control gate 16 by the high voltage applied on the control gate 16. In other words, the electrons charged in the floating gate 12A are erased by a F-N (Fowler-Nordheim) tunneling effect. Using FIG. 1E as an illustration, an erase coupling ratio ($r_E$) can be represented by Equation 2 with capacitances (C1, C2, C3, C4) of the parasitic capacitors ($C_s$, $C_c$, $C_t$, $C_{ip}$).

$$r_E = \frac{C3 + C4}{C1 + C2 + C3 + C4} \quad \text{[Equation 2]}$$

It is desirable to reduce the width 'W' of the poly oxide layer 14 with increased integration of a device. As shown in FIG. 1B, when the width of the exposed polysilicon layer 12 is reduced, the width of the opening 13B, provided for the formation of the poly oxide layer 14, is reduced. Accordingly, the thickness of the poly oxide layer 14, produced by the LOCOS process, is reduced. The reduction of the thickness of the poly oxide layer 14 increases the capacitance of the gate interlayer parasitic capacitor ($C_{ip}$) between the control gate 16 and the floating gate 12A, thereby degrading device characteristics. In other words, if the capacitance of the gate interlayer capacitor ($C_{ip}$), generated between the floating gate 12A and the control gate 16, is increased, the voltage applied on the floating gate 12A during programming is reduced, resulting in a decrease of program efficiency.

SUMMARY OF THE INVENTION

Embodiments of the present invention provide a method of fabricating a flash memory cell having a split gate structure. A method of fabricating a flash memory cell may include sequentially forming a first gate insulating layer, a floating gate layer, and a sacrificial layer on a semiconductor substrate. By patterning the sacrificial layer, a sacrificial layer pattern is formed with an opening to expose a portion of the floating gate layer. After forming a gate interlayer insulating layer pattern inside the opening, the sacrificial layer pattern is removed. By etching the floating gate layer by using the gate interlayer insulating layer pattern as an etch mask, a floating gate is formed under the gate interlayer insulating layer pattern. A second gate insulating layer is formed on the semiconductor substrate having the floating gate. A control gate, overlapping a portion of the floating gate, is formed on the second gate insulating layer.

In accordance with another exemplary embodiment of the present invention, a method of fabricating a flash memory cell may include forming a device isolation layer on a predetermined region of a semiconductor substrate, to confine an active region. Then, a first gate insulating layer, a floating gate layer, and a sacrificial layer are sequentially formed on the active region. By patterning the sacrificial layer, a sacrificial layer pattern is formed having an opening to expose a portion of the floating gate layer on the active region. The sacrificial layer pattern may overlap the device isolation layer at both ends. A gate interlayer insulating layer, filling the opening, is formed on the sacrificial layer pattern. The gate interlayer insulating layer may be planarized until the top surface of the sacrificial layer pattern is exposed, resulting in a gate interlayer insulating layer pattern. The sacrificial layer pattern may then be removed. By etching the floating gate layer by using the gate interlayer insulating layer pattern as an etch mask, a floating gate is formed under the gate interlayer insulating layer pattern. A second gate insulating layer is formed on the active region having the floating gate. A control gate is formed on the second gate insulating layer, overlapping a portion of the floating gate. In the active region of the semiconductor substrate, a source and a drain are formed, spaced from each other. The floating gate and the control gate are between the source and the drain.

BRIEF DESCRIPTION OF THE DRAWINGS

FIG. 2 is an exemplary illustration of a plane view of a fabrication process of a flash memory cell having a split gate structure.

FIGS. 3A to 3H are exemplary illustrations of sectional views of a fabrication process of the flash memory cell taken along the line of I–I' of FIG. 2.

DETAILED DESCRIPTION OF THE INVENTION

Figure 1A:
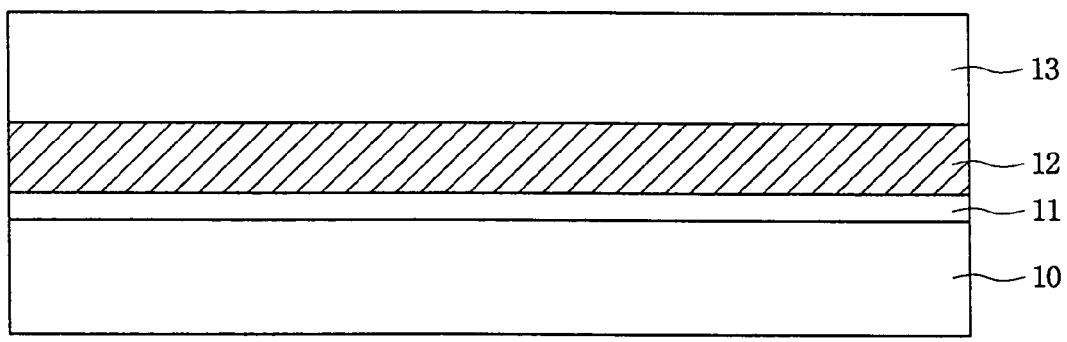
FIGS. 1A to 1E are sectional views illustrating fabrication processes of a flash memory cell.
Figure 1B:
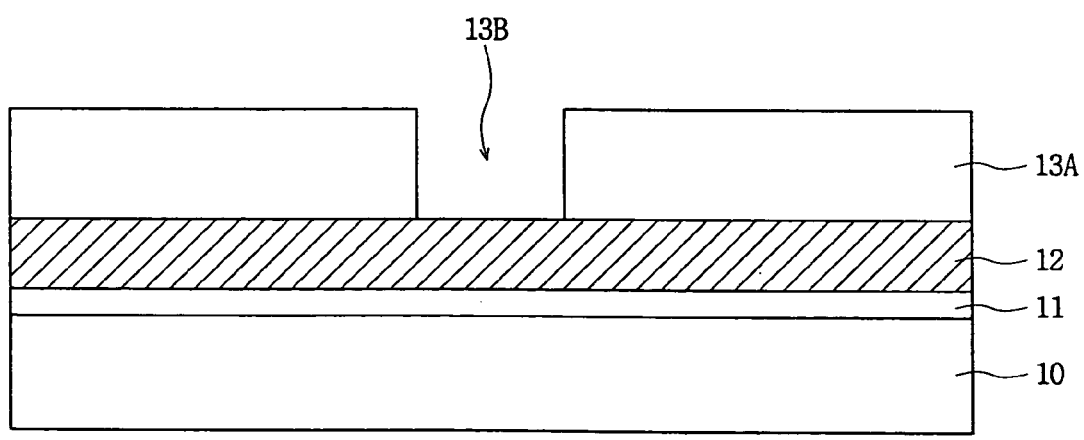
Figure 1C:
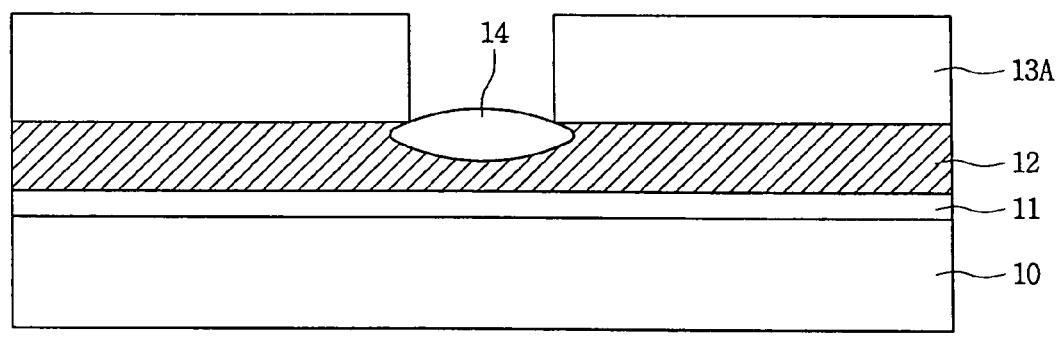
Figure 1D:
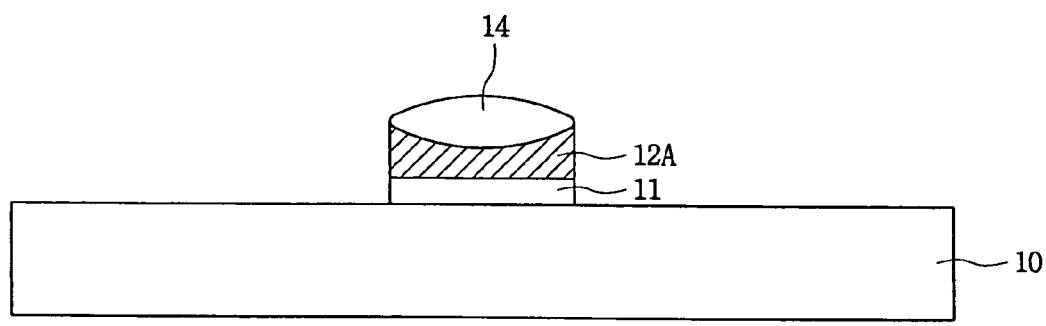
Figure 1E:
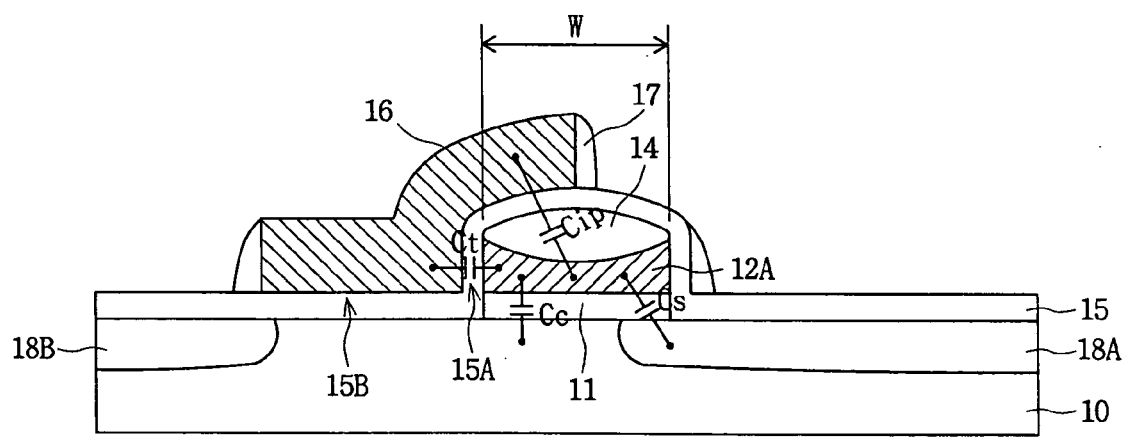

The present invention will now be described more fully hereinafter with reference to the accompanying drawings, in which embodiments of the invention are illustrated. This invention may, however, be embodied in different forms and should not be construed as limited to the embodiments set forth herein. Rather, these embodiments are provided so that this disclosure will be thorough and complete and will fully convey the scope of the invention to those skilled in the art. In the drawings, the thickness of layers and regions may be exaggerated for clarity.

FIG. 2 is an exemplary plane view illustrating a method of fabricating a flash memory cell having a split gate structure, according to embodiments of the present invention. FIGS. 3A to 3H are exemplary sectional views illustrating the fabrication processes of the flash memory cell taken along the line of I–I' of FIG. 2.

Figure 3A:
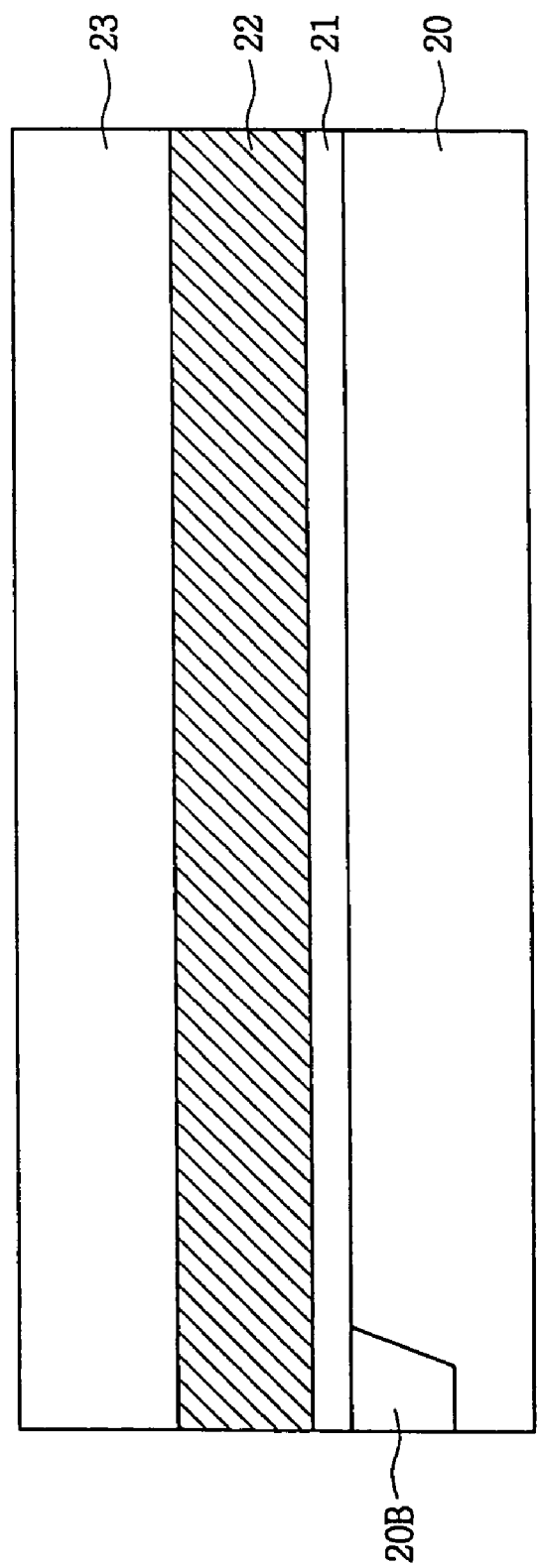

In FIGS. 2 and 3A, a device isolation layer 20B is formed on a semiconductor substrate 20 to confine an active region 20A. A first gate insulating layer 21, a floating gate layer 22, and a sacrificial layer 23 are sequentially formed on the semiconductor substrate 20. The thickness of the sacrificial layer 23 may be equal to the thickness of a gate interlayer insulating layer pattern being interposed between a floating gate and a control gate, which are formed in subsequent processes. The thickness of the sacrificial layer may be formed having the same thickness as the gate interlayer insulating layer pattern. In embodiments of the present invention, the first gate insulating layer 21 is formed of an oxide layer with a thickness of approximately 50 Å to 100 Å. The floating gate layer 22 may be formed of a polysilicon layer with a thickness of approximately 600 Å to 800 Å. The sacrificial layer 23 is may be formed of a silicon nitride layer with a thickness of approximately 900 Å to 1100 Å.

Figure 3B:
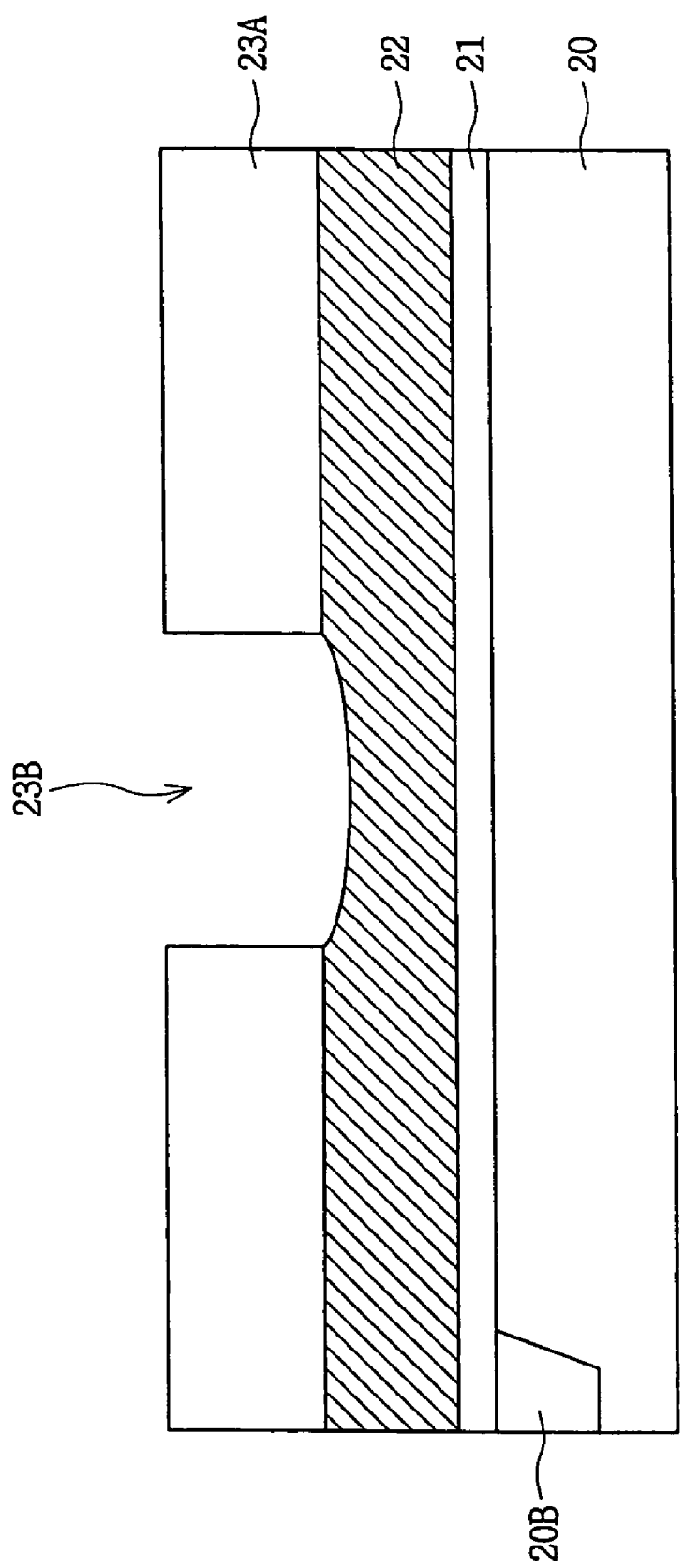

In FIG. 3B, the sacrificial layer 23 is patterned to form a sacrificial layer pattern 23A. The sacrificial layer pattern 23A has an opening 23B exposing a portion of the floating gate layer 22. The opening 23B has the same shape as the floating gate to be formed in subsequent processes. In embodiments of the present invention, the opening 23B is formed such that both its ends overlap the device isolation layer 20B, in accordance with the shape of a floating gate 22A illustrated in FIG. 2. In embodiments, over-etching during the formation of the opening 23B exposes the floating gate layer 22 on the bottom of the opening 23B. The over-etching may form a recessed portion of floating gate layer 22.

Figure 3C:
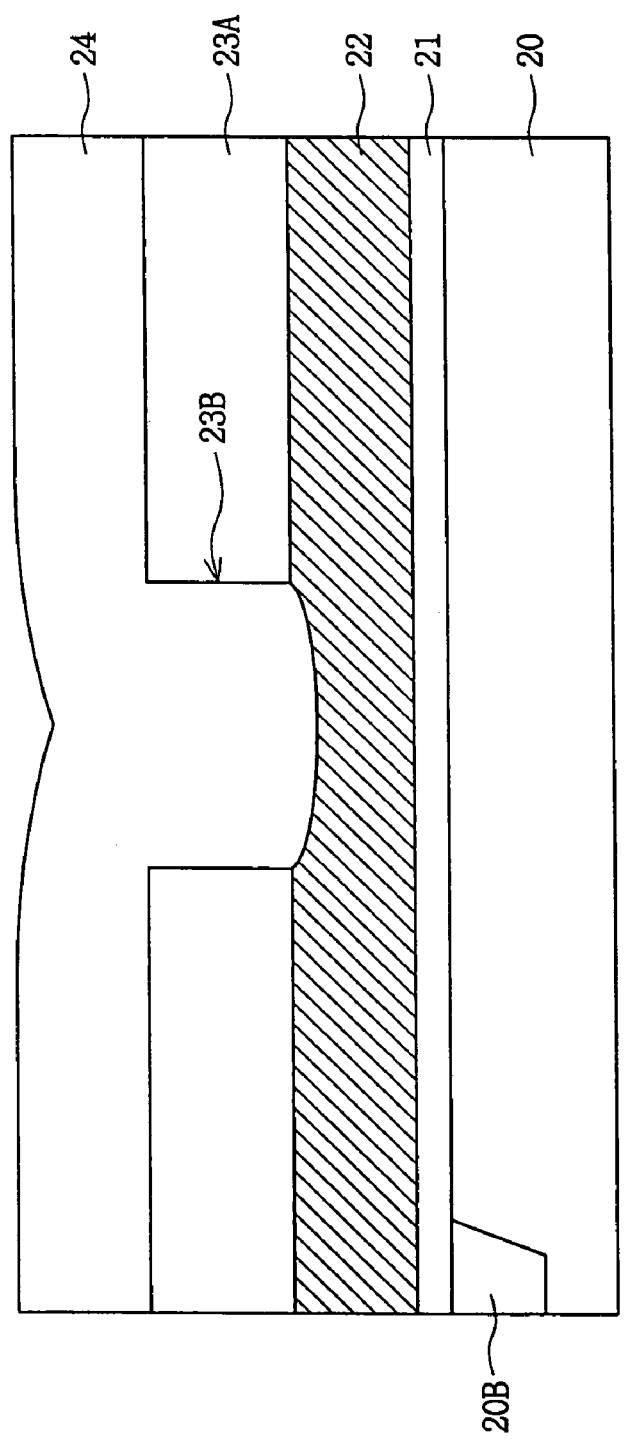

In FIG. 3C, a gate interlayer insulating layer 24 for filling the opening 23B is formed. The gate interlayer insulating layer 24 may be formed by chemical vapor deposition. The gate interlayer insulating layer 24 is a material having etch selectivity with the sacrificial layer pattern 23A. For example, the sacrificial layer pattern 23A may include silicon nitride, the gate interlayer insulating layer 24 may include an oxide material. The gate interlayer insulating layer 24 may be formed by supplying $SiH_4$ and $O_2$ gases into a PECVD (plasma enhanced CVD), an LPCVD (low pressure CVD), or an APCVD (atmospheric pressure CVD) apparatus. Alternately, the gate interlayer insulating layer 24 may be formed by supplying $Si(OC_2H_5)_4$ and $O_3$ gases and depositing an oxide layer at a temperature of approximately 300° C. to 700° C.

Figure 3D:
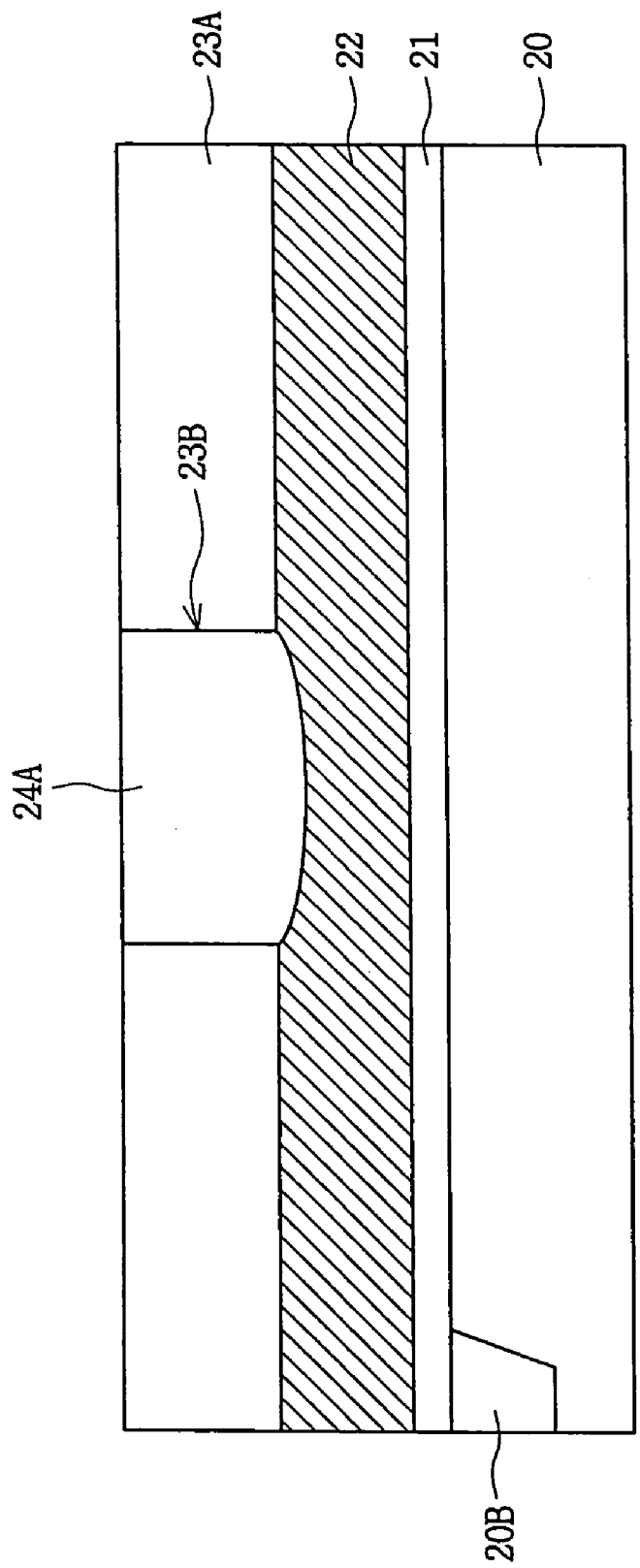

In FIG. 3D, the gate interlayer insulating layer 24 is planarized such that the top surface of the sacrificial layer pattern 23A is exposed, forming a gate interlayer insulating layer pattern 24A. The gate interlayer insulating layer pattern 24A includes the portion of the gate interlayer insulating layer 24 left inside the opening 23B after planarization. The planarization process may employ a chemical mechanical polishing using silica as slurry or a blanket etch using $CF_4$, $CHF_3$, and/or $O_2$ gas.

In FIG. 3E, the sacrificial layer pattern 23A is removed to expose the sidewalls of the gate interlayer insulating layer pattern 24A. The removal of the sacrificial layer pattern 23A exposes portions of the floating gate layer 22 which are not covered with the gate interlayer insulating layer pattern 24A. In the case that the sacrificial layer pattern 23A is formed of a silicon nitride layer, the sacrificial layer pattern 23A is removed by a wet etch using a $H_3PO_4$ solution.

Figure 3F:
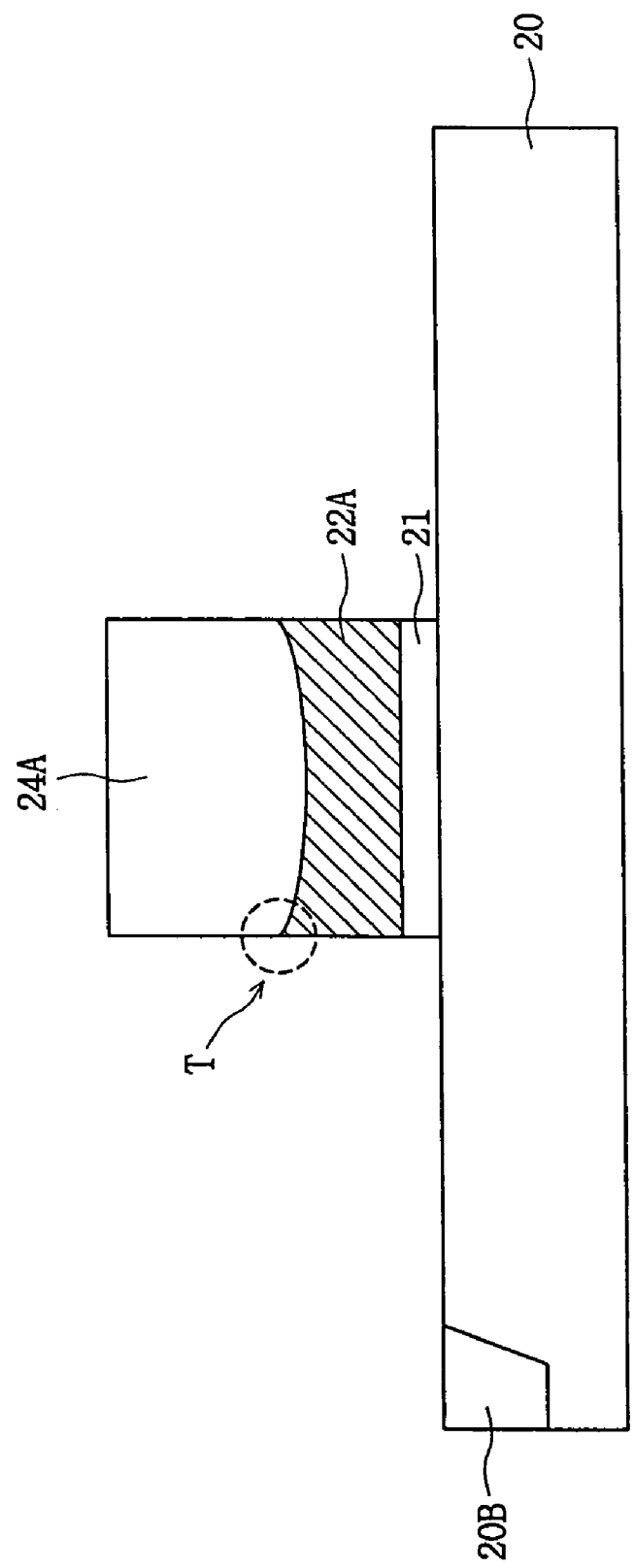

In FIGS. 2 and 3F, the exposed portion of the floating gate layer 22 is etched, using the gate interlayer insulating layer pattern 24A as an etch mask to form the floating gate 22A under the gate insulating layer pattern 24A. The gate insulating layer 21, which may be relatively thin in thickness, may be removed by an etch process. A cleaning process may be performed after the etch process to expose the surface of the semiconductor substrate 20. If the floating gate layer 22 is formed of a polysilicon layer, an anisotropic dry etch is performed by using HBr and/or $Cl_2$ to form the floating gate 22A. If the top surface of the floating gate 22A is recessed by over-etching during the formation process of the opening 23B (as shown in FIG. 3B), the upper ends of the floating gate 22A can be formed to have a tip shape 'T'. Accordingly, in embodiments, the coupling ratio between the floating gate 22A and a control gate (to be formed in a subsequent process) can be reduced and F-N (Fowler Nordheim) tunneling effect can be improved.

Figure 3G:
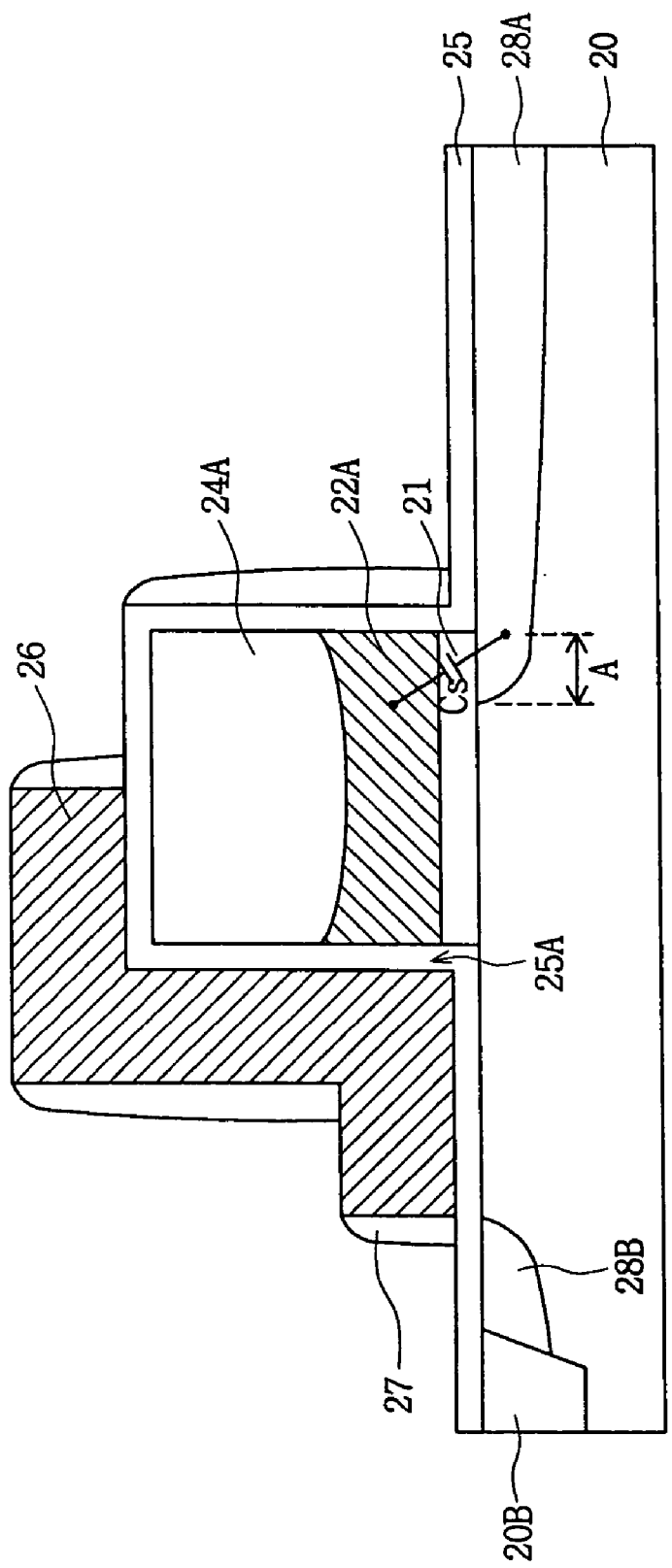

In FIGS. 2 and 3G, a second gate insulating layer 25 is formed on the semiconductor substrate having the gate insulating layer pattern 24A and the floating gate 22A. A control gate 26 is formed by depositing and patterning a conductive layer. One end of the control gate 26 covers a portion of the gate interlayer insulating layer pattern 24A, overlaps a portion of the upper surface of the floating gate 22A, and overlaps one sidewall of the floating gate 22A. The other end of the control gate 26 overlaps the semiconductor substrate 20. The second gate insulating layer 25 may be formed of an oxide layer. The control gate 26 may be formed of a polysilicon layer. The second gate insulating layer 25 functions as a tunnel insulating layer 25A between the floating gate 22A and the control gate 26. An insulating layer spacer 27 is formed on the sidewalls of the floating gate 22A and the control gate 26. Through an ion implantation process and a thermal treatment process, a source 28A and a drain 28B are formed in the semiconductor substrate 20.

A coupling ratio ($r_p$) of a flash cell having a split gate structure in programming depends on the capacitance of a source capacitor ($C_s$). Lateral diffusion may occur during the formation process of the source region 28A to increase an overlapping space A between the floating gate 22A and the source 28A. This increase of the overlapping space A increases the capacitance of the source capacitor ($C_s$).

Figure 3H:
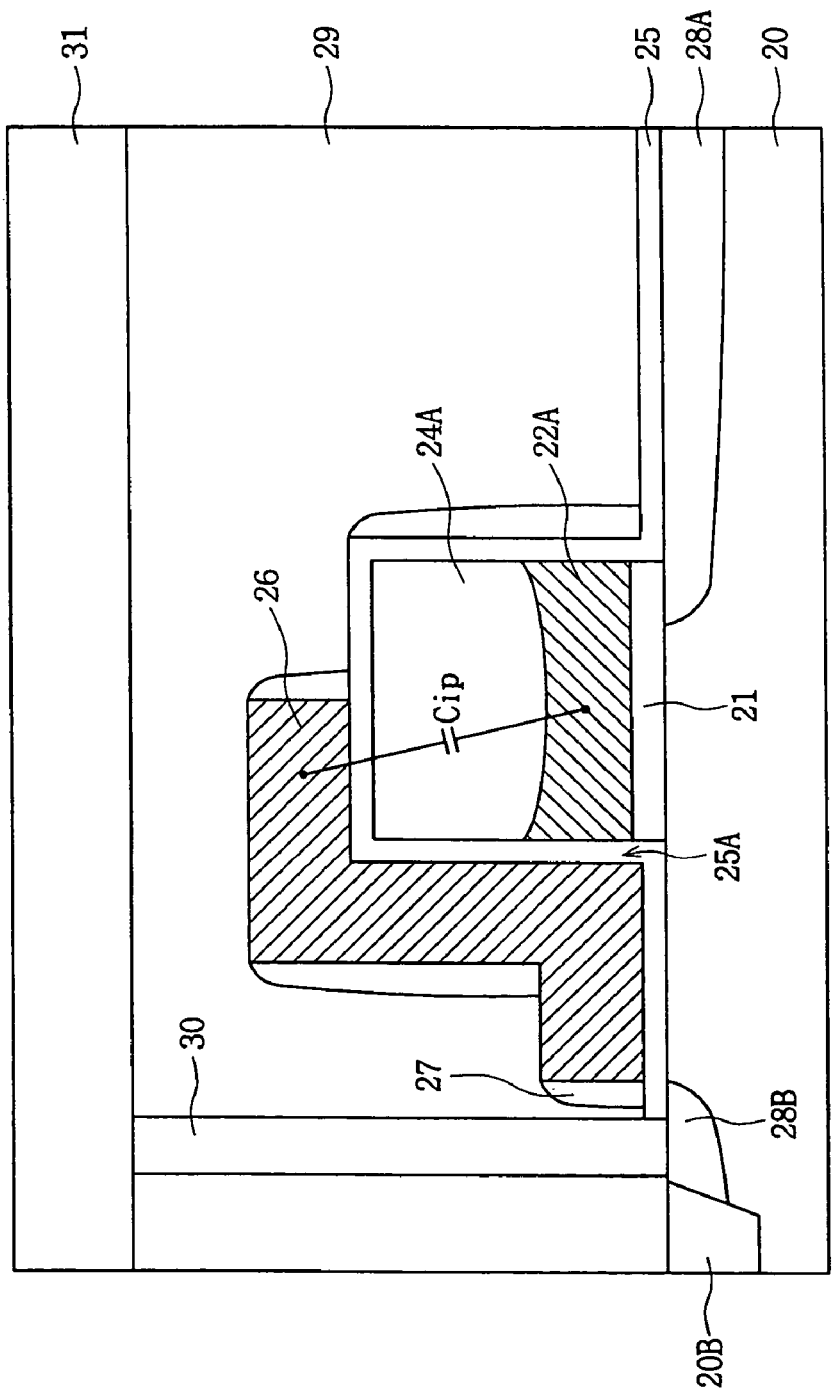

In FIGS. 2 and 3H, an interlayer insulating layer 29 is formed on the semiconductor device having the source 28A and the drain 28B. The interlayer insulating layer 29 is selectively etched to form a contact hole to expose the top surface of the drain 28B. A conductive plug 30 is formed inside the contact hole and connected to a bit line 31.

According to embodiments of the present invention, by forming a gate interlayer insulating layer inside the opening 23B, the gate interlayer insulating layer pattern 24A is formed with adequate insulation between the floating gate 22A and the control gate 26. The gate interlayer insulating layer pattern 24A may be formed by using chemical vapor deposition and a planarization processes. Accordingly, the gate interlayer insulating layer pattern 24A can be formed with uniform thickness.

By increasing the depth of the opening 23B, the gate interlayer insulating layer pattern 24A can be formed with a sufficient thickness. Sufficient thickness can be important for highly-integrated devices having smaller width. Accordingly, the capacitance of the gate interlayer capacitor ($C_{ip}$) generated between the floating gate 22A and the control gate 26 (which overlap each other with the gate interlayer insulating layer pattern 24A located in between) can be reduced. In other words, the voltage reduction of the floating gate 22A (in accordance with the capacitance increase of the gate interlayer capacitor ($C_{ip}$)) during programming can be effectively prevented, presenting a decrease of program efficiency.

According to embodiments of the present invention, a gate interlayer insulating layer pattern can be formed with an uniform thickness, by forming a floating gate and a control gate interlayer insulating layer through chemical vapor deposition and planarization processes. Further, the problems raised from a heat budget and a smiling effect can be prevented, by forming a gate interlayer insulating layer at a lower temperature than the conventional thermal oxidation process. Furthermore, the capacitance of a parasitic capacitor formed between the floating gate and the control gate can be reduced, by forming the gate interlayer insulating layer with a sufficient thickness even in a small space of the structure.

Although embodiments of the invention have been described above, it is understood that the present invention should not be limited to these embodiments, as various changes and modifications can be made by one skilled in the art utilizing the scope and spirit of the invention, as claimed in the appended claims.

What is claimed is:

1. A method of fabricating a flash memory cell comprising the steps of:
    sequentially forming a first gate insulating layer, a floating gate layer, and a sacrificial layer on a semiconductor substrate;
    patterning the sacrificial layer to form a sacrificial layer pattern having an opening to expose a portion of the floating gate layer;
    forming a gate interlayer insulating layer in the opening and on a top surface of the sacrificial layer pattern;
    removing the gate interlayer insulating layer from the top surface of the sacrificial layer pattern to form a gate interlayer insulating layer pattern in the opening;
    removing the sacrificial layer pattern;
    etching the floating gate layer by using the gate interlayer insulating layer pattern as an etch mask so as to form a floating gate under the gate interlayer insulating layer pattern;
    forming a second gate insulating layer on the semiconductor substrate having the floating gate; and
    forming a control gate on the second gate insulating layer, overlapping a portion of the floating gate.

2. The method of fabricating a flash memory cell according to claim 1, wherein the gate interlayer insulating layer is formed by using one of:
    plasma enhanced chemical vapor deposition;
    low pressure chemical vapor deposition; and
    atmospheric pressure chemical vapor deposition.

3. The method of fabricating a flash memory cell according to claim 2, wherein the gate interlayer insulating layer is formed by depositing an oxide layer at a temperature of approximately 300° C. to 700° C.

4. The method of fabricating a flash memory cell according to claim 2, wherein the gate interlayer insulating layer is removed from the top surface of the sacrificial layer pattern by planarizing the gate interlayer insulating layer until the top surface of the sacrificial layer pattern is exposed.

5. The method of fabricating a flash memory cell according to claim 4, wherein the gate interlayer insulating layer is planarized by a chemical mechanical polishing.

6. The method of fabricating a flash memory cell according to claim 4, wherein the gate interlayer insulating layer is planarized by a dry etch.

7. The method of fabricating a flash memory cell according to claim 6, wherein the gate interlayer insulating layer is formed of a material having an etch selectivity with respect to the sacrificial layer.

8. The method of fabricating a flash memory cell according to claim 7, wherein the sacrificial layer is formed of a silicon nitride layer, and the gate interlayer insulating layer is formed of an oxide layer.

9. The method of fabricating a flash memory cell according to claim 1, wherein the control gate is formed such that one end portion thereof covers a portion of the gate interlayer insulating layer pattern, overlapping a portion of the top surface of the floating gate, and the other end portion thereof overlaps the semiconductor substrate.

10. The method of fabricating a flash memory cell according to claim 1, further comprising a step of recessing the exposed floating gate layer after the step of forming the opening.

11. The method of fabricating a flash memory cell according to claim 10, wherein the floating gate is formed to have a tip shape on the upper ends.

12. A method of fabricating a flash memory cell comprising the steps of:

forming a device isolation layer on a predetermined region of a semiconductor substrate so as to confine an active region;

sequentially forming a first gate insulating layer, a floating gate layer and a sacrificial layer on the active region;

patterning the sacrificial layer to form a sacrificial layer pattern having an opening which exposes a portion of the floating gate layer on the active region and on, the device isolation layer at opposite sides of the active region;

forming a gate interlayer insulating layer, filling the opening in the sacrificial layer pattern;

planarizing the gate interlayer insulating layer until a top surface of the sacrificial layer pattern is exposed, so as to form a gate interlayer insulating layer pattern which remains inside the opening;

removing the sacrificial layer pattern;

etching the floating gate layer by using the gate interlayer insulating layer pattern as an etch mask so as to form a floating gate under the gate interlayer insulating layer pattern;

forming a second gate insulating layer on the active region having the floating gate;

forming a control gate on the second gate insulating layer, overlapping a portion of the floating gate; and forming a source and a drain on the active region, spaced from each other with the floating gate and the control gate therebetween.

13. The method of fabricating a flash memory cell according to claim 12, wherein the gate interlayer insulating layer is formed by using one of:

plasma enhanced chemical vapor deposition;

low pressure chemical vapor deposition; and atmospheric pressure chemical vapor deposition.

14. The method of fabricating a flash memory cell according to claim 13, wherein the gate interlayer insulating layer is formed by depositing an oxide layer at a temperature of approximately 300° C. to 700° C.

15. The method of fabricating a flash memory cell according to claim 12, wherein the gate interlayer insulating layer is planarized by a chemical mechanical polishing.

16. The method of fabricating a flash memory cell according to claim 12, wherein the gate interlayer insulating layer is planarized by a dry etch.

17. The method of fabricating a flash memory cell according to claim 16, wherein the gate interlayer insulating layer is formed of a material having an etch selectivity with respect to the sacrificial layer.

18. The method of fabricating a flash memory cell according to claim 12, wherein the control gate is formed such that one end portion thereof covers a portion of the gate interlayer insulating layer pattern, overlapping a portion of the top surface of the floating gate, and the other end portion thereof overlaps the active region.

19. The method of fabricating a flash memory cell according to claim 12, further comprising a step of recessing the exposed floating gate layer after the step of forming the opening.

20. The method of fabricating a flash memory cell according to claim 19, wherein the floating gate is formed to have a tip shape on the upper ends.

* * * * *